(12) United States Patent
Takeuchi et al.

(10) Patent No.: US 10,902,813 B2
(45) Date of Patent: Jan. 26, 2021

(54) SHIFT REGISTER AND DISPLAY DEVICE PROVIDED WITH SAME

(71) Applicant: SHARP KABUSHIKI KAISHA, Sakai (JP)

(72) Inventors: Yohei Takeuchi, Sakai (JP); Takuya Watanabe, Sakai (JP); Akira Tagawa, Sakai (JP); Yasuaki Iwase, Sakai (JP); Takatsugu Kusumi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 154 days.

(21) Appl. No.: 16/191,234

(22) Filed: Nov. 14, 2018

(65) Prior Publication Data

US 2019/0147822 A1     May 16, 2019

(30) Foreign Application Priority Data

Nov. 15, 2017   (JP) ................... 2017-219678

(51) Int. Cl.
*G11C 19/00*     (2006.01)
*G09G 3/36*     (2006.01)
*G11C 19/28*     (2006.01)
*G06F 3/041*     (2006.01)

(52) U.S. Cl.
CPC ......... *G09G 3/3677* (2013.01); *G06F 3/0412* (2013.01); *G06F 3/04166* (2019.05); *G11C 19/28* (2013.01); *G09G 2310/0286* (2013.01); *G09G 2310/06* (2013.01); *G11C 19/287* (2013.01)

(58) Field of Classification Search
None
See application file for complete search history.

(56) References Cited

U.S. PATENT DOCUMENTS

| | | | | |
|---|---|---|---|---|
| 2012/0320008 | A1* | 12/2012 | Takahashi | ............ G09G 3/3677 345/204 |
| 2014/0267156 | A1 | 9/2014 | Koga et al. | |
| 2017/0285375 | A1 | 10/2017 | Iwase et al. | |
| 2019/0147820 | A1* | 5/2019 | Tsai | ........................ G11C 19/28 345/208 |
| 2020/0074907 | A1* | 3/2020 | Tagawa | ..................... G09G 3/20 |

FOREIGN PATENT DOCUMENTS

| | | |
|---|---|---|
| JP | 2014-182203 A | 9/2014 |
| WO | 2016/047544 A1 | 3/2016 |

* cited by examiner

*Primary Examiner* — Tuan T Lam
(74) *Attorney, Agent, or Firm* — ScienBiziP, P.C.

(57) ABSTRACT

Each unit circuit that constitutes each of stages of a shift register is provided with a charge supply unit including a third node whose potential becomes high level at identical timing with a first node (a node for holding an electric charge in order to output a scanning signal (output signal) at high level), and capable of supplying an electric charge to the first node throughout a period after the potential of the third node becomes high level until the scanning signal (output signal) at high level is outputted. Here, all of the unit circuits within the shift register have an identical configuration.

7 Claims, 12 Drawing Sheets

SHIFT REGISTER AND DISPLAY DEVICE PROVIDED WITH SAME

BACKGROUND OF THE INVENTION

1. Field of the Invention

The present disclosure relates to a shift register, and in particular to a shift register provided for a display device having a touch panel.

2. Description of Related Art

Conventionally, there is known an active matrix-type liquid crystal display device including a display unit that includes a plurality of source bus lines (video signal lines) and a plurality of gate bus lines (scanning signal lines). For such a liquid crystal display device, conventionally, a gate driver (scanning signal line drive circuit) for driving the gate bus lines is often mounted as an IC (Integrated Circuit) chip on the periphery of a substrate that constitutes a liquid crystal panel. However, in recent years, it becomes increasingly common to provide a gate driver directly on a TFT substrate which is one of two glass substrates that constitute a liquid crystal panel. Such a gate driver is called a "monolithic gate driver", and the like.

In a display unit of an active matrix-type liquid crystal display device, a plurality of source bus lines, a plurality of gate bus lines, and a plurality of pixel formation portions disposed at respective intersections of the plurality of source bus lines and the plurality of gate bus lines are formed. The plurality of pixel formation portions are arranged in a matrix and form a pixel array. Each of the pixel formation portions includes: a thin film transistor which is a switching element having a gate terminal connected to a gate bus line that passes through a corresponding intersection and a source terminal connected to a source bus line that passes through the intersection; a pixel capacitance for holding a pixel voltage value; and the like. The active matrix-type liquid crystal display device is also provided with the gate driver described above and a source driver (video signal line drive circuit) for driving the source bus lines.

Video signals representing pixel voltage values are transmitted by the source bus lines. However, each of the source bus lines cannot transmit a video signal representing pixel voltage values for a plurality of rows at one time (simultaneously). Accordingly, writing (charging) of the video signals to the pixel capacitances in the pixel formation portions arranged in a matrix is performed sequentially row by row. Therefore, the gate driver is configured by a shift register including a plurality of stages so that the plurality of gate bus lines are sequentially selected for a predetermined period. Further, by sequentially outputting active scanning signals from the respective stages of the shift register, writing of the video signals to the pixel capacitances is performed sequentially row by row as described above.

As used herein, a circuit that forms each of the stages of the shift register is referred to as a "unit circuit". Further, sequentially selecting the gate bus lines one by one from a first row to a last row is simply referred to as "scanning", and stopping the scanning in the course of scanning from the first row to the last row is referred to as "suspension of scanning". Moreover, a period during which the scanning is suspended is referred to as a "suspension period".

FIG. 13 is a circuit diagram illustrating an example of a configuration of a conventional unit circuit. In the unit circuit illustrated in FIG. 13, when a set signal S changes from low level to high level, a potential of the first node N1 increases due to pre-charging. By an input clock signal CLKin changing from low level to high level when the first node N1 is in a pre-charged state in this manner, the potential of the first node N1 increases to a large extent, and an output signal Q is turned to high level. With this, a gate bus line connected to this unit circuit is turned to a selected state. By sequentially performing the above operation from a first stage to a last stage of the shift register, the plurality of gate bus lines provided for the display unit are sequentially turned to the selected state for a predetermined period.

Meanwhile, in recent years, a liquid crystal display device having a configuration in which a touch panel and a liquid crystal panel are combined in one piece has been widely spread. With such a liquid crystal display device, it is necessary to perform processing for the touch panel (e.g., processing for detecting a touch position) when scanning is not performed. Accordingly, a suspension period in which scanning is suspended is provided during a frame period (vertical scanning period). In this regard, it is necessary to increase duration of a suspension period as the sensitivity of the touch panels becomes higher, or as loads on the panels become greater along with increased sizes of the liquid crystal panels and high resolution thereof. During the suspension period, it is necessary for a unit circuit corresponding to the scanning stop position (restart position) to maintain a state in which the first node N1 (see FIG. 13) is pre-charged throughout the suspension period. However, since a thin film transistor has a characteristic of letting a drain current Id flow to some extent even when a the gate-source voltage Vgs is 0 as shown in FIG. 14 (see a portion indicated by a reference number 91 in FIG. 14), increasing the duration of a suspension period results in a reduced potential at the first node N1 during the suspension period due to charge leakage (off leakage) at thin film transistors T3 and T4 in the example shown in FIG. 13. In such a case, the potential of the output signal Q may not sufficiently increase, even if the input clock signal CLKin changes from low level to high level after the suspension period is over. This results in an abnormal operation. As described above, according to the conventional liquid crystal display device, it has been difficult to ensure an extended suspension period for suspension of scanning.

Therefore, Japanese Laid-Open Patent Publication No. 2014-182203 discloses the invention relating to a shift register capable of enabling suspension of scanning by making a configuration of a unit circuit ("transfer circuit" in Japanese Laid-Open Patent Publication No. 2014-182203) corresponding to a position at which suspension of scanning is to be performed to be able to hold a potential of an inputted shift signal (shift pulse) for a long period. Further, relating to the invention of the present application, WO 2016/047544 discloses a configuration in which there is provided, within a unit circuit, a stabilization node control unit for stabilizing a potential of a stabilization node (a second node N2 corresponds to the stabilization node in the configuration shown in FIG. 13) connected to a gate terminal of a thin film transistor for stabilizing a potential at an output control node (the first node N1 corresponds to the output control node in the configuration shown in FIG. 13) within the unit circuit.

However, according to the shift register disclosed in Japanese Laid-Open Patent Publication No. 2014-182203, suspension of scanning may be performed only at a specific position, and it is not possible to perform suspension of scanning at any position. As described above, the shift register disclosed in Japanese Laid-Open Patent Publication No. 2014-182203 lacks versatility, as its drive method is limited. Accordingly, for example, it is not possible for the liquid crystal display device having a configuration in which a touch panel and a liquid crystal panel are combined in one piece to quickly perform processing for detecting a touch position. In particular, in recent years, development of a full in-cell type touch panel utilizing a common electrode as an electrode for touch position detection is conducted actively, and performing suspension of scanning at any position is becoming essential. Further, the shift register disclosed in Japanese Laid-Open Patent Publication No. 2014-182203 has a problem that a pattern inspection in a manufacturing process of TFT substrates becomes complicated, because a configuration of a unit circuit corresponding to a position as at which scanning can be suspended is different from a configuration of a unit circuit corresponding to a position as at which scanning cannot be suspended. It should be noted that the configuration disclosed in WO 2016/047544 is for maintaining a potential of an output control node at low level so that a gate bus line may not become the selected state unnecessarily, and not for maintaining a potential of an output control node at a sufficient level so that a gate bus line may become the selected state without any failure.

SUMMARY OF THE INVENTION

Thus, it is desired to realize a shift register capable of performing suspension of scanning at any stage without complicating a pattern inspection in a manufacturing process.

A shift register according to some embodiments is a shift register capable of performing a shift operation based on a shift clock signal group including a plurality of clock signals, the shift register being configured by a plurality of stages having an identical configuration, wherein each of unit circuits that respectively constitute the stages includes:
  a charge holding node configured to hold an electric charge in order to output an output signal at on level;
  an output node configured to output the output signal;
  an output control transistor having: a control terminal connected to the charge holding node; a first conducting terminal to which one of the plurality of clock signals included in the shift clock signal group is supplied; and a second conducting terminal connected to the output node; and
  a charge supply unit including a charge supply control node that is turned to on level at identical timing with the charge holding node, the charge supply unit being capable of supplying an electric charge to the charge holding node throughout a period after a potential of the charge supply control node becomes on level until the output signal at on level is outputted from the output node.

According to the above configuration, each of the unit circuits that respectively constitute the stages is provided with the charge supply unit including the charge supply control node whose potential becomes on level at the identical timing with the charge holding node (a node for holding an electric charge in order to output an on-level output signal), the charge supply unit being capable of supplying an electric charge to the charge holding node throughout a period after the potential of the charge supply control node becomes on level until the on-level output signal is outputted. Accordingly, at the unit circuit at which the potential of the charge supply control node is at on level, an electric charge is supplied to the charge holding node as needed throughout the suspension period in which the clock operation of the plurality of clock signals is suspended. Therefore, even when duration of a suspension period is set to be extended, charge leakage at the transistor within the unit circuit will not make the potential of the charge holding node at off level during the suspension period. Specifically, the potential of the charge holding node is maintained at on level sufficiently throughout the suspension period. As a result, the scanning is normally restarted from the suspension stage after the suspension period ends. In addition, all of the unit circuits within the shift register have the same configuration. Accordingly, it is possible to perform suspension of scanning at any stage, and a pattern inspection in a manufacturing process of substrates may not become complicated. From the above, it is possible to realize a shift register capable of performing suspension of scanning at any stage without complicating the pattern inspection in the manufacturing process.

These and other objects, features, aspects, and effects of the present invention may become more apparent from the following detailed description of the present invention with reference to the appended drawings.

DETAILED DESCRIPTION OF PREFERRED EMBODIMENTS

Hereinafter, embodiments will be described. In the following description, a gate terminal (gate electrode) of a thin film transistor corresponds to a control terminal, a drain terminal (drain electrode) thereof corresponds to a first conducting terminal, and a source terminal (source electrode) thereof corresponds to a second conducting terminal. Further, in this regard, while one of drain and source with a higher potential is called drain regarding an n-channel type transistor, in the description herein, one is defined as drain, and the other is defined as source, and therefore a source potential can be higher than a drain potential.

1. First Embodiment

<1.1 Overall Configuration and General Operation>

Figure 2:
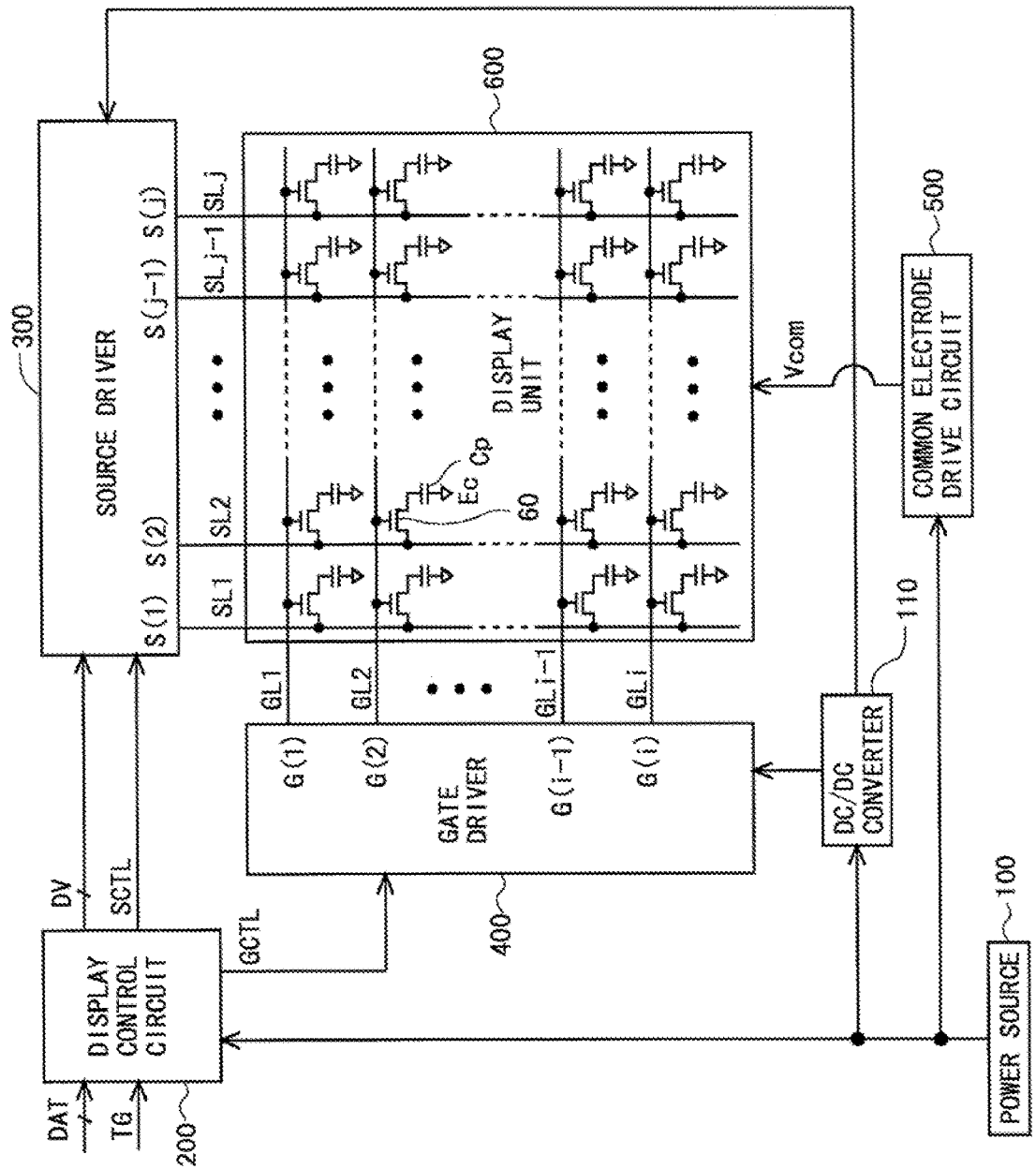
FIG. 2 is a block diagram illustrating an overall configuration of an active matrix-type liquid crystal display device according to the first embodiment.

FIG. 2 is a block diagram illustrating an overall configuration of an active matrix-type liquid crystal display device according to a first embodiment. As shown in FIG. 2, this liquid crystal display device includes a power source 100, a DC/DC converter 110, a display control circuit 200, a source driver (video signal line drive circuit) 300, a gate driver (scanning signal line drive circuit) 400, a common electrode drive circuit 500, and a display unit 600. In this embodiment, the gate driver 400 and the display unit 600 are provided on the same substrate (a TFT substrate which is one of two substrates that constitute a liquid crystal panel). Specifically, the gate driver 400 according to this embodiment is a monolithic gate driver. In this embodiment, it is assumed that a liquid crystal panel that constitutes the display unit 600 is combined in one piece with a touch panel. However, the touch panel will not be described nor shown in the drawings, as it does not directly relate to the present invention.

The display unit 600 is provided with a plurality of (j) source bus lines (video signal lines) SL1-SLj, a plurality of (i) gate bus lines (scanning signal lines) GL1-GLi, and a plurality of (i×j) pixel formation portions respectively disposed at intersections between the plurality of source bus lines SL1-SLj and the plurality of gate bus lines GL1-GLi. The plurality of pixel formation portions are arranged in a matrix and constitute a pixel array. Each of the pixel formation portions includes: a thin film transistor (TFT) 60, which is a switching element, having a gate terminal connected to one of the gate bus lines that passes through a corresponding intersection and a source terminal connected to one of the source bus lines that passes through the same intersection; a pixel electrode connected to a drain terminal of the thin film transistor 60; a common electrode Ec which is a counter electrode commonly provided for the plurality of pixel formation portions; and a liquid crystal layer commonly provided for the plurality of pixel formation portions and sandwiched between the pixel electrode and the common electrode Ec. Further, a pixel capacitance Cp is configured by a liquid crystal capacitance formed by the pixel electrode and the common electrode Ec. In general, an auxiliary capacitance is provided in parallel with the liquid crystal capacitance in order to ensure that a charge is held by the pixel capacitance Cp. However, the auxiliary capacitance will not be described nor shown in the drawings, as it does not directly relate to the present invention. Moreover, the thin film transistor 60 in this embodiment is an n-channel type.

In the meantime, examples of the thin film transistor 60 to be employed include: a thin film transistor in which amorphous silicon is used for a semiconductor layer (a-Si TFT); a thin film transistor in which microcrystalline silicon is used for a semiconductor layer; a thin film transistor in which oxide semiconductor is used for a semiconductor layer (oxide TFT); and a thin film transistor in which low-temperature polysilicon is used for a semiconductor layer (LTPS-TFT). As the oxide TFT, for example, a thin film transistor having an oxide semiconductor layer including In—Ga—Zn—O-based semiconductor (e.g., indium gallium zinc oxide) may be employed. These also apply to a thin film transistor within the gate driver 400.

The power source 100 supplies a predetermined power-supply voltage to the DC/DC converter 110, the display control circuit 200, and the common electrode drive circuit 500. The DC/DC converter 110 generates, from the power-supply voltage, direct voltages (a direct power-supply voltage VDD and a direct power-supply voltage VSS) for operating the source driver 300 and the gate driver 400, and supplies the generated voltages to the source driver 300 and the gate driver 400. The common electrode drive circuit 500 supplies a common electrode drive voltage Vcom to the common electrode Ec.

The display control circuit 200 receives an image signal DAT and a group of timing signals TG, such as a horizontal synchronization signal and a vertical synchronization signal, that are supplied from outside, and outputs a digital video signal DV, a source control signal SCTL for controlling an operation of the source driver 300, and a gate control signal GCTL for controlling an operation of the gate driver 400. The source control signal SCTL includes signals such as a source start pulse signal, a source clock signal, and a latch strobe signal. The gate control signal GCTL includes signals such as a gate start pulse signal and a gate clock signal.

The source driver 300 applies driving video signals S(1)-S(j) to the source bus lines SL1-SLj, based on the digital video signal DV and the source control signal SCTL transmitted from a display control circuit 200. At this time, at timing at which a pulse of the source clock signal is generated, the source driver 300 sequentially holds digital video signals DV each indicating a voltage to be applied to each of the source bus lines SL. Then, at timing at which a pulse of the latch strobe signal is generated, the digital video signals DV that are being held are converted into analog voltages. The converted analog voltages are applied to all of the source bus lines SL1-SLj at once as the driving video signals S(1)-S(j).

The gate driver 400 repeats application of the active scanning signals G(1)-G(i) to the respective gate bus lines GL1-GLi with a vertical scanning period as a cycle, based on the gate control signal GCTL transmitted from the display control circuit 200. Specifically, the gate driver 400 performs scanning of the gate bus lines GL1-GLi. However, suspension of scanning is performed when processing for the touch panel is performed. Details of the gate driver 400 will be described later.

As described above, by applying the driving video signals S(1)-S(j) to the source bus lines SL1-SLj, and by applying the scanning signals G(1)-G(i) to the gate bus lines GL1-GLi, an image based on the image signal DAT that is externally supplied is displayed on the display unit 600.

<1.2 Gate Driver>

Figure 3:
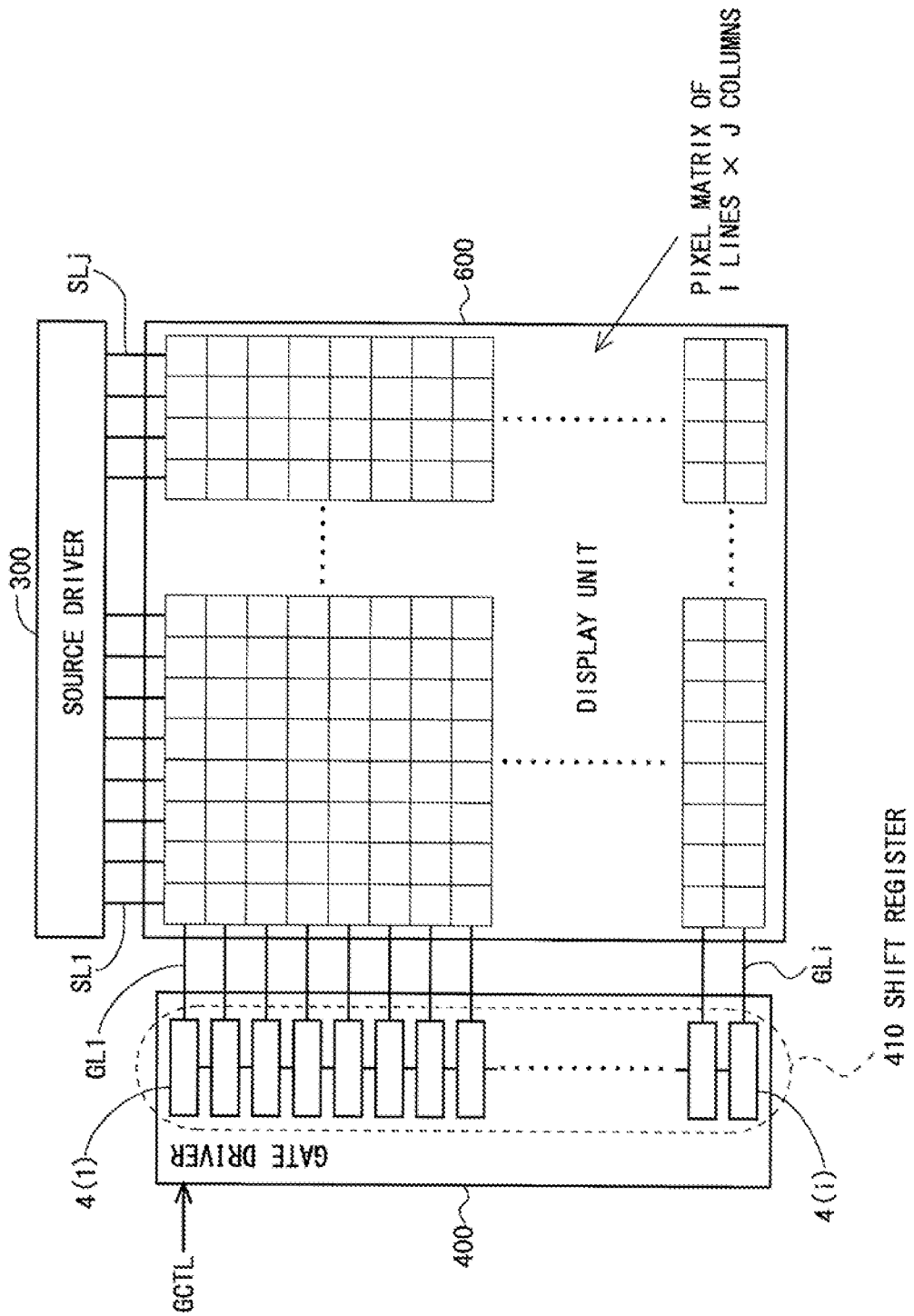
FIG. 3 is a block diagram for illustration of a configuration of a gate driver according to the first embodiment.

FIG. 3 is a block diagram for illustration of a configuration of the gate driver 400 according to this embodiment. As shown in FIG. 3, the gate driver 400 is configured by a shift register 410 constituted by a plurality of stages. The display unit 600 is provided with a pixel matrix of i lines×j columns, and each of the stages of the shift register 410 is provided so as to correspond to each lines of the pixel matrix one by one. Specifically, the shift register 410 includes i unit circuits 4(1)-4(i). Hereinafter, a configuration and an operation of the gate driver 400 will be described in detail.

<1.2.1 Configuration and Operation of Entire Shift Register>

Figure 4:
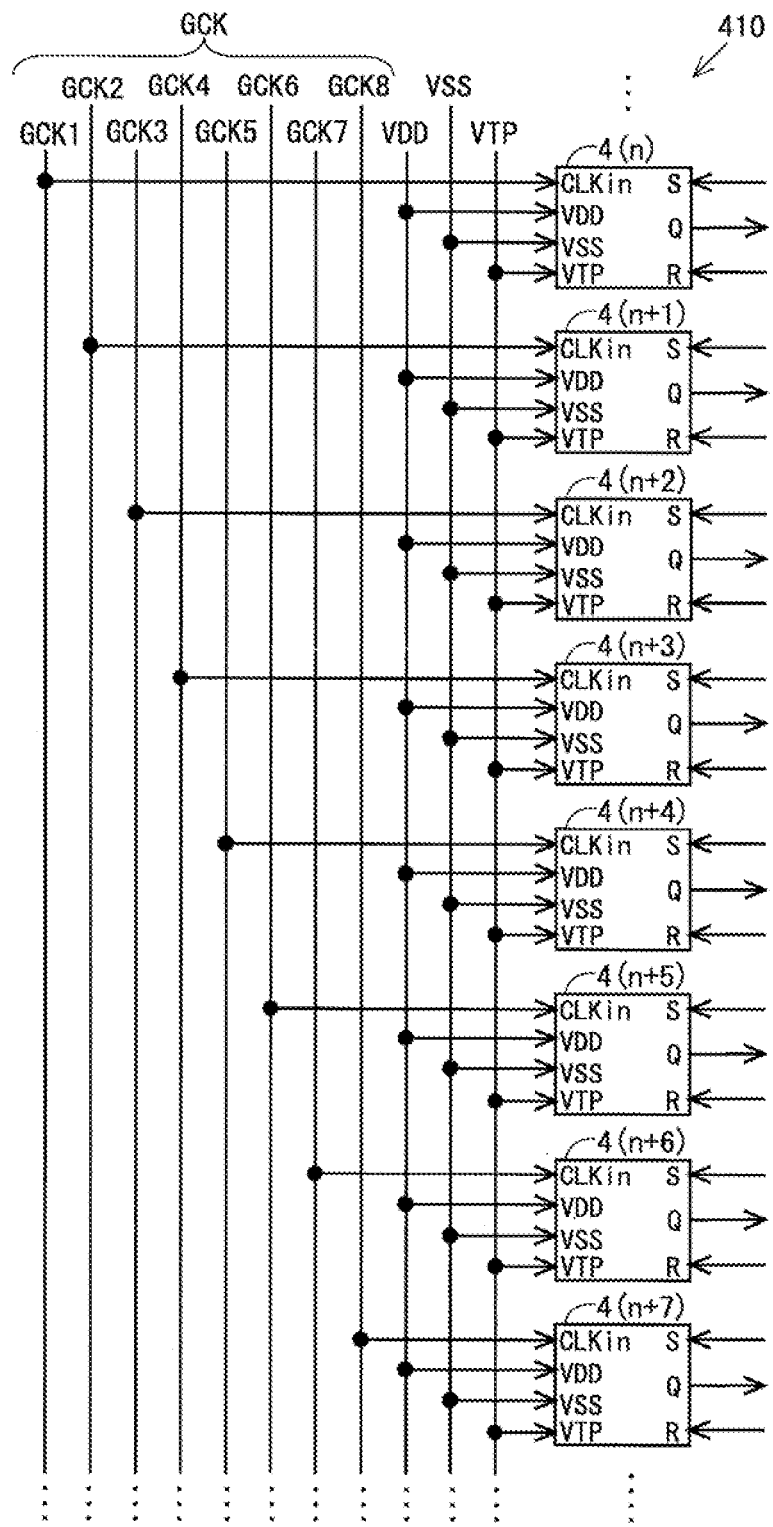
FIG. 4 is a block diagram illustrating a configuration of a shift register within the gate driver according to the first embodiment.

FIG. 4 is a block diagram illustrating a configuration of the shift register 410 within the gate driver 400. As described above, the shift register 410 is configured by i unit circuits 4(1)-4(i). In FIG. 4, the unit circuits 4(n)-4(n+7) from a n-th stage to a (n+7)th stage are shown. In the following description, a reference number 4 is assigned to a unit circuit when the i circuits 4(1)-4(i) are not required to be distinguished from each other.

To the shift register 410, as the gate control signals GCTL, a gate start pulse signal (not shown in FIG. 4), a clear signal (not shown in FIG. 4), gate clock signals GCK (GCK1 to GCK8), and a control signal VTP are supplied. Further, the high-level direct power-supply voltage VDD and the low-level direct power-supply voltage VSS are also supplied to the shift register 410. The gate clock signals GCK1 to GCK8 are eight-phase clock signals. Out of the eight-phase clock signals, a clock signal inputted to each of the unit circuits 4 (hereinafter referred to as an "input clock signal") is indicated by a reference symbol CLKin.

Figure 5:
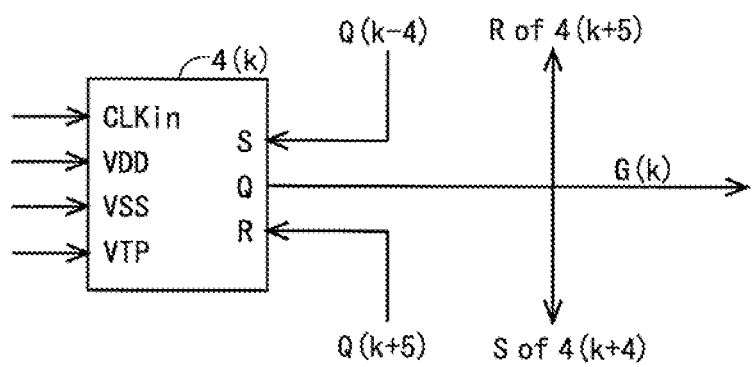
FIG. 5 is a diagram for illustration of input and output signals of the unit circuit according to the first embodiment.

Signals supplied to input terminals of each stage (each of the unit circuits 4) of the shift register 410 are as follows. Regarding the gate clock signal, the gate clock signal GCK1 is supplied to the unit circuit 4(n) of the n-th stage, the gate clock signal GCK2 is supplied to the unit circuit 4(n+1) of the (n+1)th stage, the gate clock signal GCK3 is supplied to the unit circuit 4(n+2) of the (n+2)th stage, the gate clock signal GCK4 is supplied to the unit circuit 4(n+3) of the (n+3)th stage, the gate clock signal GCK5 is supplied to the unit circuit 4(n+4) of the (n+4)th stage, the gate clock signal GCK6 is supplied to the unit circuit 4(n+5) of the (n+5)th stage, the gate clock signal GCK7 is supplied to the unit circuit 4(n+6) of the (n+6)th stage, and the gate clock signal GCK8 is supplied to the unit circuit 4(n+7) of the (n+7)th stage. Such a configuration is repeated every eight stages for all stages throughout the shift register 410. Further, as shown in FIG. 5, for a unit circuit 4(k) of any stage (k-th stage, here, k is an integer no smaller than 1 and no greater than i), an output signal Q(k−4) outputted from a unit circuit 4(k−4) that is four stages before is supplied as a set signal S, and an output signal Q(k+5) outputted from a unit circuit 4(k+5) that is five stages after is supplied as a reset signal R. However, a gate start pulse signal is supplied as the set signal S to a predetermined number of unit circuits 4 of lower-numbered stages, and a clear signal is supplied as the reset signal R to a predetermined number of the unit circuit 4 of higher-numbered stages. For the gate start pulse signal, only one gate start pulse signal may be used, or a plurality of gate start pulse signals may be used. This applies to the clear signal. The direct power-supply voltage VDD, the direct power-supply voltage VSS, and the control signal VTP are commonly supplied to all of the unit circuits 4(1)-4(i).

From an output terminal of each stage (each of the unit circuits 4) of the shift register 410, an output signal Q is outputted (see FIG. 5). The output signal Q outputted from any stage (k-th stage, here, k is an integer no smaller than 1 and no greater than i) is supplied to a gate bus line GLk of a k-th row as a scanning signal G (k), as well as to a unit circuit 4(k−5) that is five stages before as the reset signal R, and to a unit circuit 4(k+4) that is four stages after as the set signal S.

Figure 6:
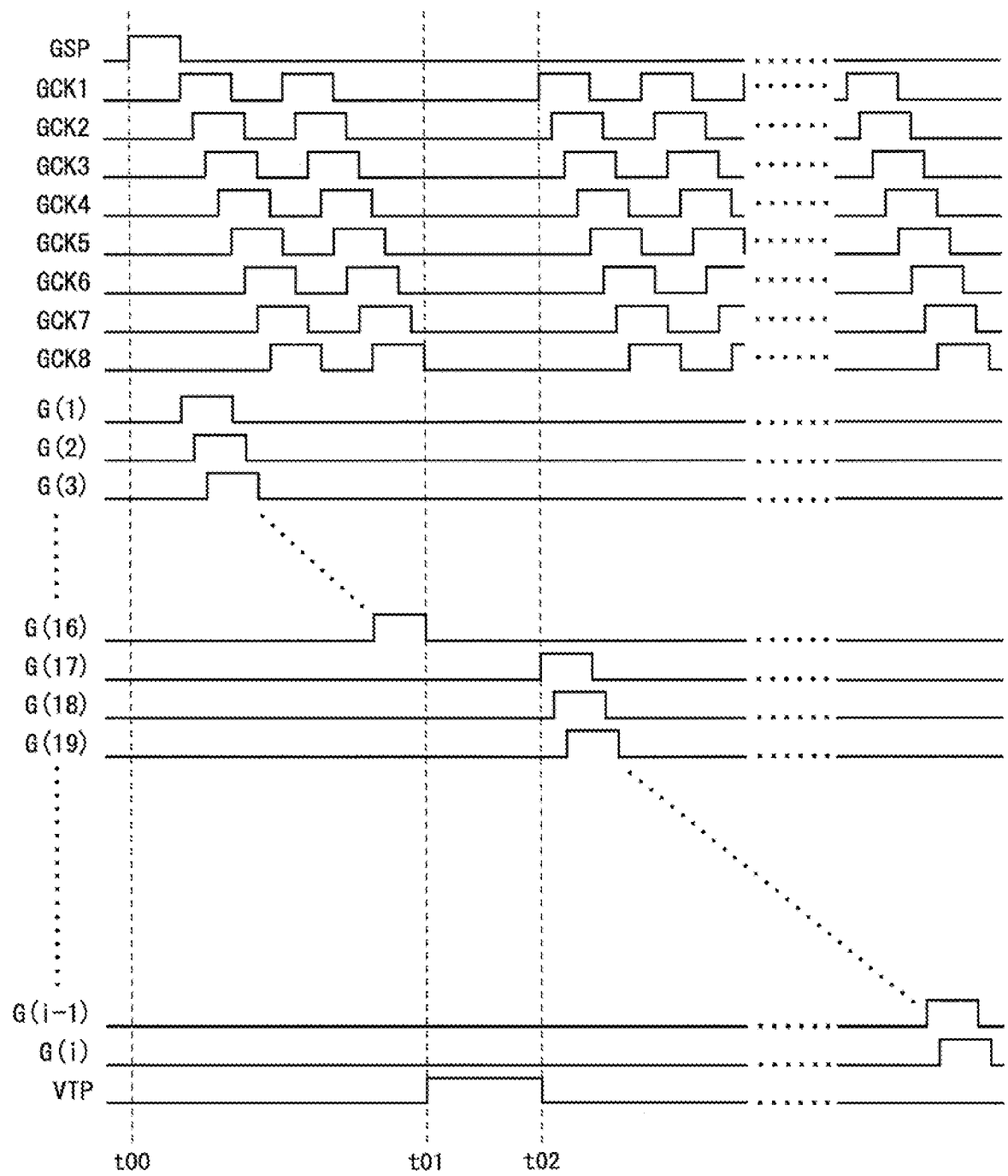
FIG. 6 is a signal waveform diagram for illustration of an operation of the gate driver according to the first embodiment.

FIG. 6 is a signal waveform diagram for illustration of an operation of the gate driver 400. In the above configuration, after a pulse of a gate start pulse signal GSP is generated at a time point t00, based on a clock operation of the gate clock signals GCK1 to GCK8, a shift pulse included in the output signal Q outputted from each of the unit circuits 4 is transferred sequentially to the higher-numbered stages (that is, a shift operation is performed). Then, in response to the transfer of the shift pulse, the output signal Q outputted from each of the unit circuits 4 is sequentially turned to high level. With this, as shown in FIG. 6, the scanning signals G(1) to G(i) that are sequentially turned to high level (active) for a predetermined period are supplied to the gate bus lines GL1 to GLi within the display unit 600. Specifically, i gate bus lines GL1 to GLi are sequentially in a selected state.

In the meantime, in this embodiment, suspension of scanning is allowed. In the example shown in FIG. 6, a period from a time point t01 to a time point t02 is a suspension period in which scanning is suspended. During the suspension period, the clock operation of gate clock signals GCK1 to GCK8 is stopped, and the control signal VTP is maintained at high level. By such an operation being performed during the suspension period and each of the unit circuits 4 being configured in a manner later described, the scanning is restarted when the suspension period is over as shown in FIG. 6. Here, during the suspension period, processing for the touch panel (for example, processing for detecting a touch position) is performed.

<1.2.2 Configuration of Unit Circuit>

Figure 1:
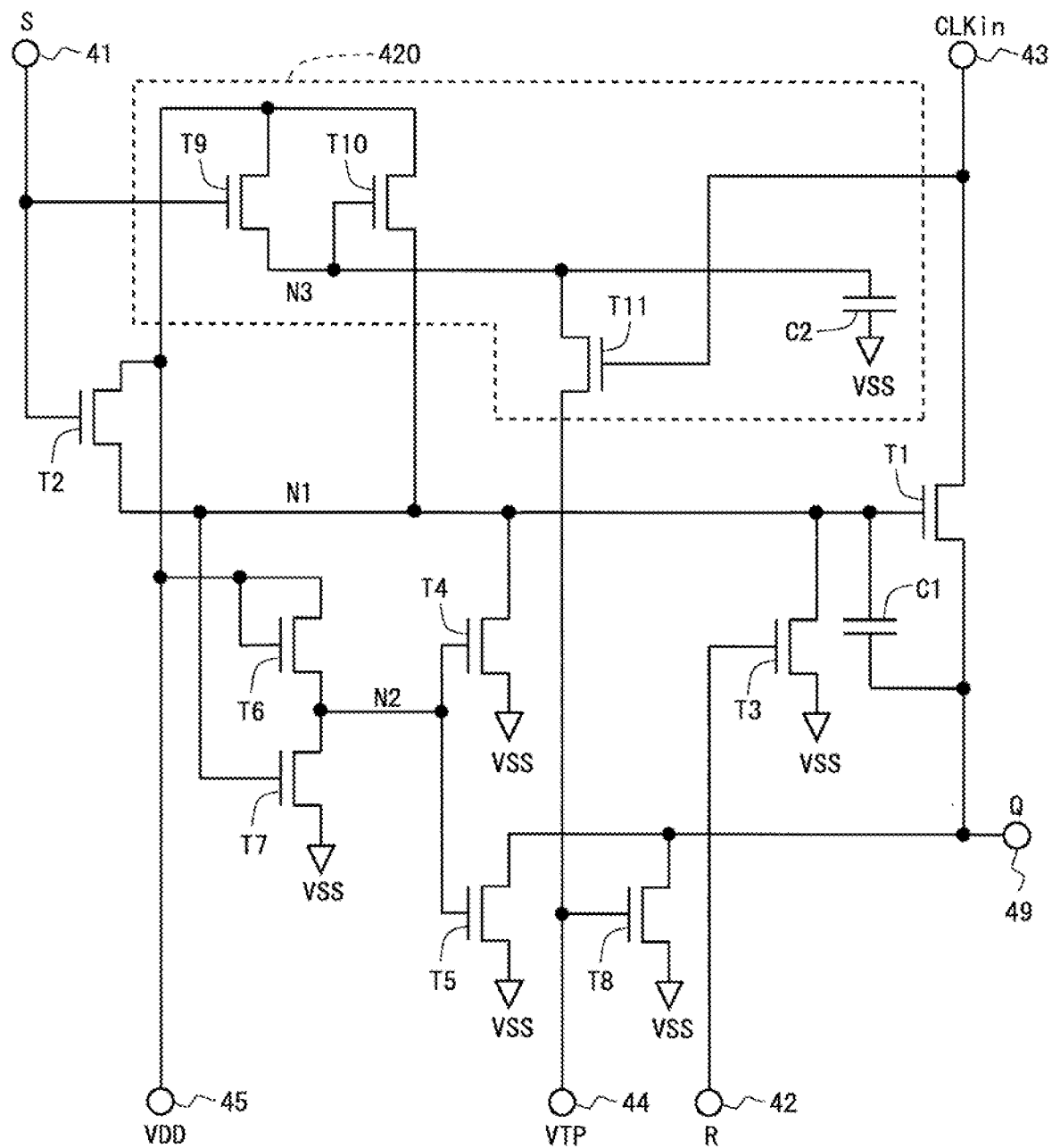
FIG. 1 is a circuit diagram illustrating a configuration of a unit circuit according to a first embodiment.

FIG. 1 is a circuit diagram illustrating a configuration of the unit circuit 4 according to this embodiment. As shown in FIG. 1, the unit circuit 4 includes eleven thin film transistors T1 to T11, and two capacitors (capacitative elements) C1 and C2. Further, the unit circuit 4 includes, in addition to an input terminal for the direct power-supply voltage VSS, five input terminals 41 to 45 and one the output terminal 49. Here, an input terminal for receiving the set signal S is indicated by a reference number 41, an input terminal for receiving the reset signal R is indicated by a reference number 42, an input terminal for receiving the input clock signal CLKin is indicated by a reference number 43, an input terminal for receiving the control signal VTP is indicated by a reference number 44, and an input terminal for receiving the direct power-supply voltage VDD is indicated by a reference number 45. Moreover, an output terminal for outputting the output signal Q is indicated by a reference number 49. It should be noted that unlike the shift register disclosed in Japanese Laid-Open Patent Publication No. 2014-182203, all of the unit circuits 4(1)-4(i) within the shift register 410 has a configuration that is the same as the configuration shown in FIG. 1.

Next, connection relationship between components within the unit circuit 4 will be described. A gate terminal of the thin film transistor T1, a source terminal of the thin film transistor T2, a drain terminal of the thin film transistor T3, a drain terminal of the thin film transistor T4, a gate terminal of the thin film transistor T7, a source terminal of the thin film transistor T10, and one end of the capacitor C1 are connected to each other via a first node N1. A gate terminal of the thin film transistor T4, a gate terminal of the thin film transistor T5, a source terminal of the thin film transistor T6, and a drain terminal of the thin film transistor T7 are connected to each other via a second node N2. A source terminal of the thin film transistor T9, a gate terminal of the thin film transistor T10, a drain terminal of the thin film transistor T11, and one end of the capacitor C2 are connected to each other via a third node N3.

Regarding the thin film transistor T1, the gate terminal is connected to the first node N1, a drain terminal is connected to the input terminal 43, and a source terminal is connected to the output terminal 49. Regarding the thin film transistor T2, a gate terminal is connected to the input terminal 41, a drain terminal is connected to the input terminal 45, and the source terminal is connected to the first node N1. It should be noted that a configuration in which the drain terminal of the thin film transistor T2 is connected to the input terminal 41 may be employed. Regarding the thin film transistor T3, a gate terminal is connected to the input terminal 42, the drain terminal is connected to the first node N1, and a source terminal is connected to the input terminal for the direct power-supply voltage VSS. Regarding the thin film transistor T4, the gate terminal is connected to the second node N2, the drain terminal is connected to the first node N1, and a source terminal is connected to the input terminal for the direct power-supply voltage VSS. Regarding the thin film transistor T5, the gate terminal is connected to the second node N2, a drain terminal is connected to the output terminal 49, and a source terminal is connected to the input terminal for the direct power-supply voltage VSS. Regarding the thin film transistor T6, a gate terminal and a drain terminal is connected to the input terminal 45 (that is, diode-connected), and the source terminal is connected to the second node N2. Regarding the thin film transistor T7, the gate terminal is connected to the first node N1, the drain terminal is connected to the second node N2, and a source terminal is connected to the input terminal for the direct power-supply voltage VSS.

Regarding the thin film transistor T8, a gate terminal is connected to the input terminal 44, a drain terminal is connected to the output terminal 49, and a source terminal is connected to the input terminal for the direct power-supply voltage VSS. Regarding the thin film transistor T9, a gate terminal is connected to the input terminal 41, a drain terminal is connected to the input terminal 45, and the source terminal is connected to the third node N3. It should be noted that a configuration in which the drain terminal of the thin film transistor T9 is connected to the input terminal 41 may be employed. Regarding the thin film transistor T10, the gate terminal is connected to the third node N3, a drain terminal is connected to the input terminal 45, and the source terminal is connected to the first node N1. Regarding the capacitor C1, the one end is connected to the first node N1, and the other end is connected to the output terminal 49. Regarding the capacitor C2, the one end is connected to the third node N3, and the other end is connected to the input terminal for the direct power-supply voltage VSS.

Next, functions of the components will be described. The thin film transistor T1 supplies a potential of the input clock signal CLKin to the output terminal 49, when a potential of the first node N1 is at high level. The thin film transistor T2 changes the potential of the first node N1 to high level, when the set signal S is at high level. The thin film transistor T3 changes the potential of the first node N1 to low level, when the reset signal R is at high level. The thin film transistor T4 changes the potential of the first node N1 to low level, when the potential of the second node N2 is at high level. The thin film transistor T5 changes a potential of the output terminal 49 (a potential of the output signal Q) to low level, when a potential of the second node N2 is at high level. The thin film transistor T6 maintains the potential of the second node N2 at high level, unless the thin film transistor T7 is in an on state. The thin film transistor T7 changes the potential of the second node N2 to low level, when the potential of the first node N1 is at high level. The thin film transistor T8 changes the potential of the output terminal 49 (the potential of the output signal Q) to low level, when the control signal VTP is at high level. The thin film transistor T9 changes a potential of the third node N3 to high level, when the set signal S is at high level. The thin film transistor T10 supplies an electric charge to the first node N1 as needed throughout a period in which the potential of the third node N3 is maintained at high level. The thin film transistor T11 supplies the potential of the control signal VTP to the third node N3, when the input clock signal CLKin is at high level. The capacitor C1 serves as a bootstrap capacitance for increasing the potential of the first node N1. The capacitor C2 serves as a capacitance for maintaining the potential of the third node N3. In this embodiment, the thin film transistors T9 to T11 and the capacitor C2 constitute a charge supply unit 420 for supplying an electric charge to the first node N1.

It should be noted that, in this embodiment, the first node N1 realizes a charge holding node, and the third node N3 realizes a charge supply control node. Further, the thin film transistor T1 realizes an output control transistor, the thin film transistor T8 realizes an output-node turn-off transistor, the thin film transistor T9 realizes a charge supply control node turn-on transistor, the thin film transistor T10 realizes a first charge supply control transistor, and the thin film transistor T11 realizes a charge supply control node turn-off transistor.

<1.2.3 Operation of Unit Circuit>

Next, an operation of the unit circuit 4 will be described. First, an operation when suspension of scanning is not performed will be described, and then an operation when the suspension of scanning is performed will be described. In the following description, out of the plurality of stages (i stages) that constitute the shift register 410, stages for which it is necessary to prevent a decrease of the potential of the first node N1 due to charge leakage during the suspension period are referred to as "latch stages", for convenience. The latch stages include a stage corresponds to a scanning stop position (hereinafter referred to as a "suspension stage") and stages near the suspension stage.

<1.2.3.1 Operation when Suspension of Scanning is not Performed>

Figure 7:
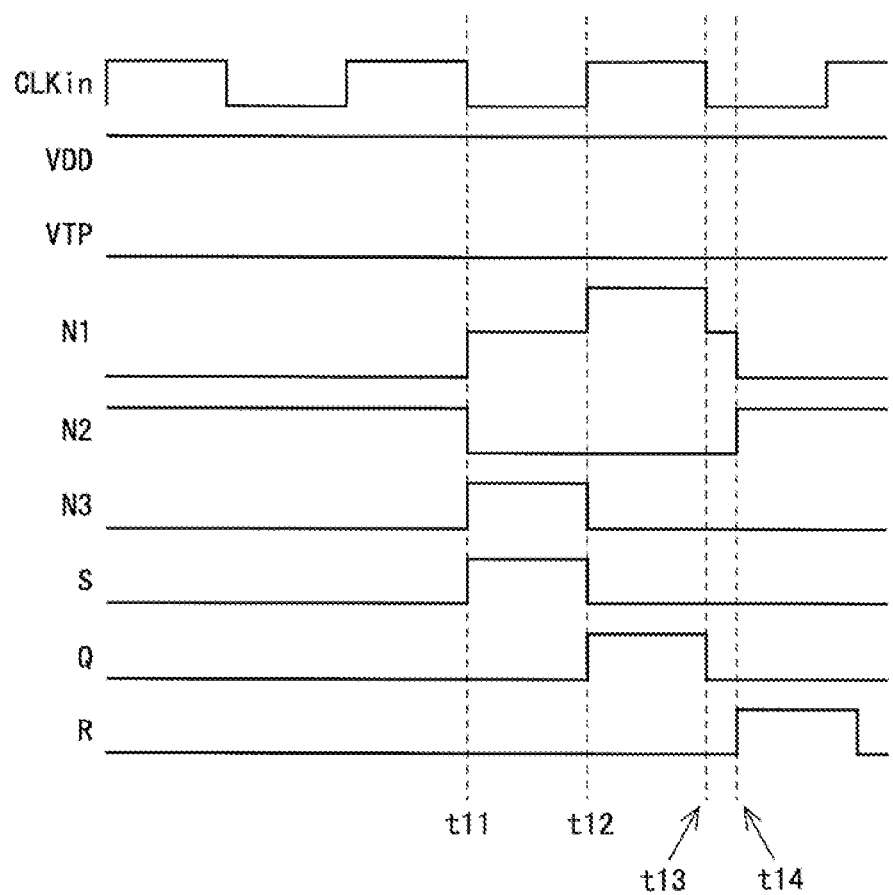
FIG. 7 is a signal waveform diagram for illustration of one example of an operation at the unit circuit when suspension of scanning is not performed according to the first embodiment.

FIG. 7 is a signal waveform diagram for illustration of one example of an operation at the unit circuit 4 when suspension of scanning is not performed. In a period before a time point t11, the control signal VTP is at low level, the potential of the first node N1 is at low level, the potential of the second node N2 is at high level, the potential of the third node N3 is at low level, the set signal S is at low level, the output signal Q is at low level, and the reset signal R is at low level. The input clock signal CLKin repeats high level and low level alternately. In the meantime, a parasitic capacitance is present at the thin film transistor T1 within the unit circuit 4. Accordingly, in the period before the time point t11, the potential of the first node N1 may fluctuate, due to the clock operation of the input clock signal CLKin and a presence of the parasitic capacitance at the thin film transistor T1. Therefore, the potential of the output terminal 49 (the potential of the output signal Q), that is, a potential of the scanning signal G supplied to the gate bus line GL may increase. However, in a period in which the potential of the second node N2 is maintained at high level, the thin film transistors T4 and T5 are maintained in the on state. Therefore, in the period before the time point t11, the thin film transistors T4 and T5 are maintained in the on state, and the potential of the first node N1 and the potential of the output terminal 49 (the potential of the output signal Q) are reliably maintained at low level. From the above, even if a noise due to the clock operation of the input clock signal CLKin is mixed into the first node N1, a potential of the corresponding scanning signal G may not increase. With this, occurrence of an abnormal operation due to the clock operation of the input clock signal CLKin may be prevented.

At the time point t11, the set signal S changes from low level to high level. Accordingly, the thin film transistor T2 is turned to the on state to charge the capacitor C1, and the thin film transistor T9 is turned to the on state to charge the capacitor C2. With this, the potential of the first node N1 and the potential of the third node N3 change from low level to high level. As the potential of the first node N1 becomes high level, the thin film transistor T1 is turned to the on state. However, as the input clock signal CLKin is at low level at the time point t11, the output signal Q is maintained at low level. Further, as the potential of the first node N1 changes from low level to high level, the thin film transistor T7 is turned to the on state. With this, the potential of the second node N2 is turned to low level, and the thin film transistors T4 and T5 are turned to the off state. It should be noted that, during a period from the time point t11 to a time point t12, the reset signal R is maintained at low level. Therefore, the potential of the first node N1 may not decrease during this period. Further, at the time point t11, although the potential of the third node N3 becomes high level as described above, the potential of the first node N1 also becomes high level. Therefore, a gate-source voltage Vgs at the thin film transistor T10 becomes 0, and the thin film transistor T10 is maintained in the off state. It should be noted that, if the potential of the first node N1 decreases down to a level at which the gate-source voltage Vgs at the thin film transistor T10 becomes greater than a threshold voltage and a drain-source voltage Vds at the thin film transistor T10 becomes greater than 0 due to charge leakage at the thin film transistors T3 and T4, an electric charge is supplied to the first node N1 via the thin film transistor T10 by the thin film transistor T10 being turned to the on state. However, as a period in which any first node N1 is bootstrapped is not assumed to be a long period like the suspension period, a period from the time point t11 to the time point t12 in which the first node N1 within the unit circuit 4 one row before is bootstrapped is not as long as the suspension period, and normally supply of an electric charge to the first node N1 is not performed.

At the time point t12, the input clock signal CLKin changes from low level to high level. At this time, as the thin film transistor T1 is in the on state, the potential of the output terminal 49 increases as a potential at the input terminal 43 increases. Here, as the capacitor C1 is disposed between the first node N1 and the output terminal 49 as shown in FIG. 1, the potential of the first node N1 increases (the first node N1 is bootstrapped) as the potential of the output terminal 49 increases. As a result, a large voltage is applied to the gate terminal of the thin film transistor T1, and the potential of the output signal Q increases up to a level that is sufficient for the gate bus line GL connected to the output terminal 49 of the unit circuit 4 to be turned to the selected state. It should be noted that, during a period from the time point t12 to a time point t13, the reset signal R is maintained at low level, and the potential of the second node N2 is also maintained at low level. Therefore, the potential of the first node N1 and the potential of the output terminal 49 (the potential of the output signal Q) may not decrease during this period. Further, at the time point t12, the thin film transistor T11 is turned to the on state by the input clock signal CLKin changing from low level to high level as described above. At this time, as the control signal VTP is at low level, the potential of the third node N3 becomes low level by the thin film transistor T11 being turned to the on state. At this time, the thin film transistor T10 is maintained in the off state. It should be noted that while supply of an electric charge to the first node N1 is not performed in the period from the time point t12 to the time point t13, the period in which any first node N1 is bootstrapped (the period from the time point t12 to the time point t13, in this example) is not assumed to be a long period like the suspension period, and therefore charge leakage at the thin film transistors T3 and T4 and the like may not cause any abnormal operation.

At the time point t13, the input clock signal CLKin changes from high level to low level. With this, the potential of the output terminal 49 (the potential of the output signal Q) decreases as the potential at the input terminal 43 decreases. When the potential of the output terminal 49 decreases, the potential of the first node N1 also decreases via the capacitor C1. It should be noted that, as the potential of the first node N1 is maintained at high level until a time point t14, the potential of the output terminal 49 becomes low level via the thin film transistor T1 in a period from the time point t13 to the time point t14 by the input clock signal CLKin changing from high level to low level.

At the time point t14, the reset signal R changes from low level to high level. With this, the thin film transistor T3 is turned to the on state. As a result, the potential of the first node N1 decreases down to low level. With this, the thin film transistor T7 is turned to the off state, and the potential of the second node N2 changes from low level to high level. As a result, the thin film transistors T4 and T5 are turned to the on state, and the potential of the first node N1 and the potential of the output terminal 49 (the potential of the output signal Q) are pulled to low level. In a period after the time point t14, an operation that is the same as that in the period before the time point t11 is performed.

By the operation described above being performed by each of the unit circuits 4, the plurality of gate bus lines GL(1) to GL(i) provided for the liquid crystal display device sequentially become the selected state, and writing to the pixel capacitances is performed sequentially.

<1.2.3.2 Operation when Suspension of Scanning is Performed>

Figure 8:
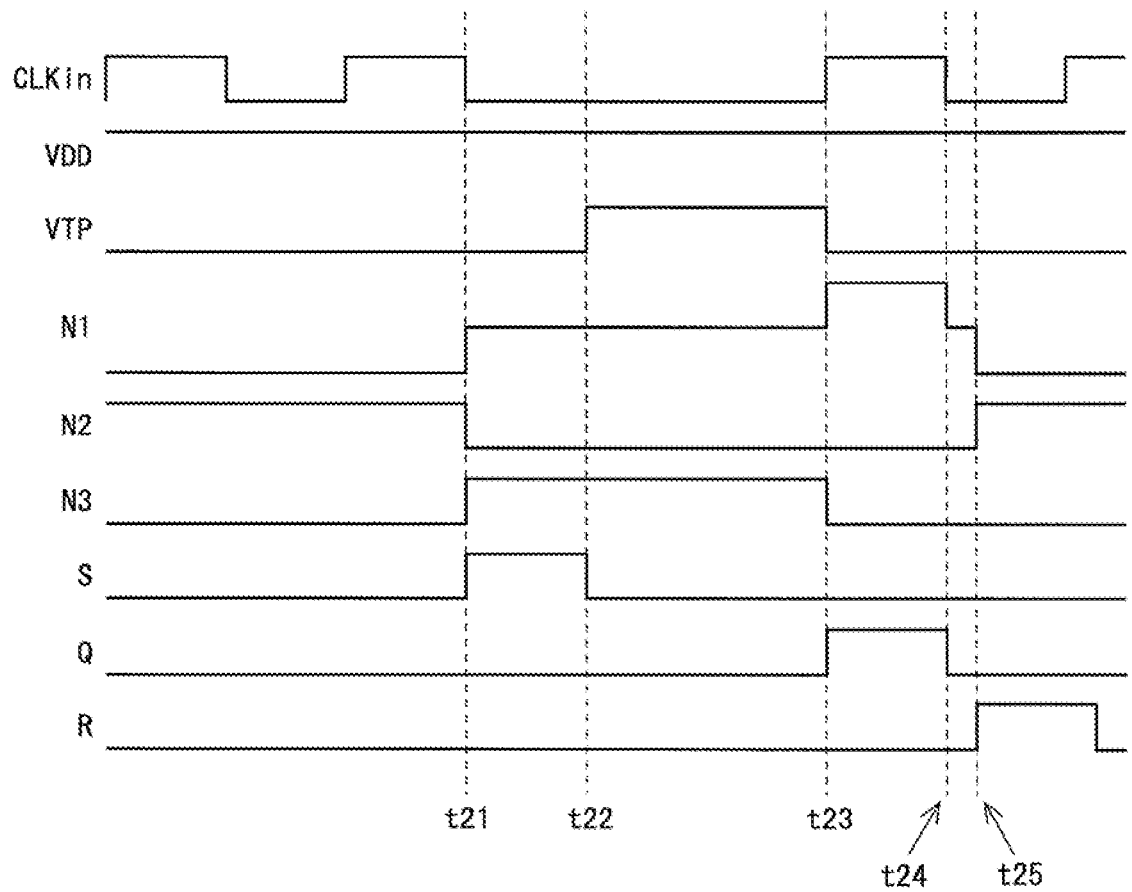
FIG. 8 is a signal waveform diagram for illustration of one example of an operation at the unit circuit (a unit circuit at a suspension stage) when suspension of scanning is performed according to the first embodiment.

FIG. 8 is a signal waveform diagram for illustration of one example of an operation at the unit circuit (a unit circuit at a suspension stage) 4 when suspension of scanning is performed. It should be noted that a period from a time point t22 to a time point t23 is assumed to be the suspension period. During a period before a time point t21, the same operation as in the period before the time point t11 (see FIG. 7) in which the suspension of scanning is not performed is performed. Also, during a period from the time point t21 to the time point t22, the same operation as in the period from the time point t11 to the time point t12 (see FIG. 7) in which the suspension of scanning is not performed is performed. Specifically, in the period from the time point t21 to the time point t22, normally, the thin film transistor T10 is maintained in the off state, and supply of an electric charge to the first node N1 is not performed.

In this case, the input clock signal CLKin is maintained at low level even at the time point t22. Therefore, the thin film transistor T11 is maintained in the off state, and the potential of the third node N3 is maintained at high level. Here, if the gate-source voltage Vgs at the thin film transistor T10 becomes greater than a threshold voltage and a drain-source voltage Vds at the thin film transistor T10 becomes greater than 0 by the potential of the first node N1 decreasing, an electric charge is supplied to the first node N1 via the thin film transistor T10 by the thin film transistor T10 being turned to the on state. With this, the potential of the first node N1 may be maintained at a level that is sufficiently high, even if charge leakage occurs at the thin film transistors T3 and T4 in such a case as one in which duration of a suspension period is extended. Further, at the time point t22, the control signal VTP changes from low level to high level. In this regard, the control signal VTP is commonly supplied to all of the unit circuits 4. Therefore, the thin film transistors T8 within all of the unit circuits 4 are turned to the on state, and the potentials of the output signals Q from all of the unit circuits 4 (that is, all of the potentials of the scanning signals G) are pulled to low level.

At the time point t23, the suspension period ends, and the control signal VTP changes from high level to low level. With this, the thin film transistor T8 is turned to the off state. Further, at the time point t23, the input clock signal CLKin changes from low level to high level. At this time, the potential of the first node N1 is maintained at a level that is sufficiently high. From the above, an operation that is the same as the operation at the time point t12 (see FIG. 7) when the suspension of scanning is not performed is performed. With this, the potential of the output signal Q increases up to a level that is sufficient for the gate bus line GL connected to the output terminal 49 of this unit circuit 4 to be turned to the selected state. Further, at the time point t23, the control signal VTP becomes low level and the input clock signal CLKin becomes high level as described above, the potential of the third node N3 becomes low level by the thin film transistor T11 being turned to the on state. In a period after a time point t24, an operation that is the same as the operation in the period after the time point t13 (see FIG. 7) when the suspension of scanning is not performed is performed.

As described above, at the unit circuit 4 that is the suspension stage, the potential of the first node N1 is maintained at high level throughout the suspension period. Then, after the suspension period ends, the output signal Q becomes high level based on the clock operation of the input clock signal CLKin. Likewise, at the unit circuits 4 of the latch stages other than the suspension stage, the potential of the first node N1 is maintained at high level throughout the suspension period. Then, after the suspension period ends, the output signal Q becomes high level based on the clock operation of the corresponding input clock signal CLKin. In this manner, the scanning is restarted from the suspension stage after the suspension period ends.

<1.3 Effects>

Figure 9:
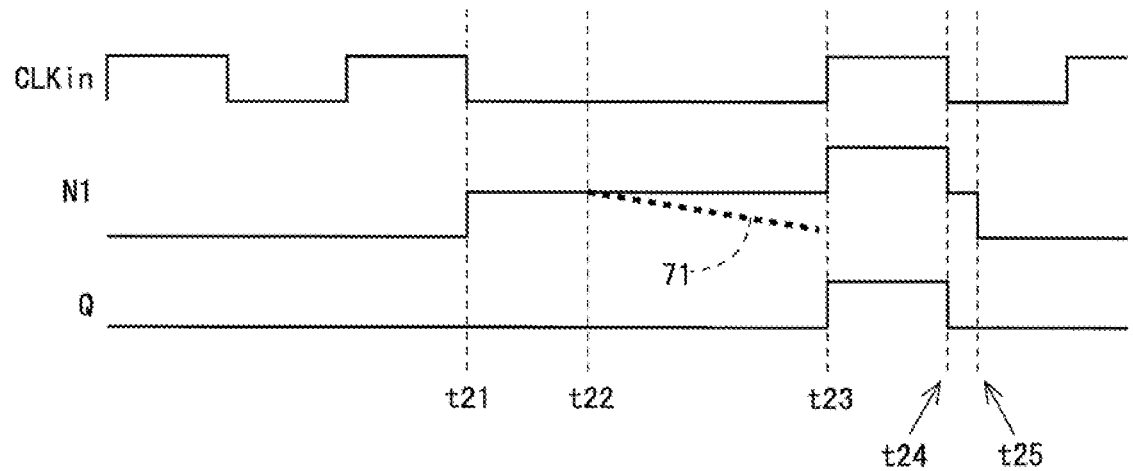
FIG. 9 is a signal waveform diagram for illustration of effects of the first embodiment.

According to this embodiment, the unit circuit 4 that constitutes each of the stages of the shift register 410 within the gate driver 400 is provided with the charge supply unit 420 including the third node N3 whose potential becomes high level at the same timing as the first node (a node for holding an electric charge in order to output a scanning signal G at high level) N1, and capable of supplying an electric charge to the first node N1 throughout a period after the potential of the third node N3 becomes high level until the output signal Q at high level is outputted. Accordingly, an electric charge is supplied to the first node N1 as needed throughout the suspension period. Therefore, even when duration of the suspension period is set to be extended and even if charge leakage occurs at the thin film transistors T3 and T4, the potential of the first node N1 may not decrease during the suspension period as indicated by a heavy dotted line represented by a reference number 71 in FIG. 9. Specifically, the potential of the first node N1 is maintained at high level throughout the suspension period. As a result, the scanning is normally restarted from the suspension stage after the suspension period ends.

Further, according to this embodiment, all of the unit circuits 4(1)-4(i) within the shift register 410 have the same configuration (the configuration shown in FIG. 1). Accordingly, it is possible to perform suspension of scanning at any stage. In addition, a pattern inspection in a manufacturing process of a TFT substrate that constitutes a liquid crystal panel may not become complicated.

From the above, according to this embodiment, it is possible to realize a shift register capable of performing suspension of scanning at any stage without complicating the pattern inspection in the manufacturing process.

2. Second Embodiment

A second embodiment of the present invention will be described. An overall configuration and an outline of a configuration and an operation of the gate driver 400 are the same as those in the first embodiment, and will not be described (see FIG. 2 to FIG. 6). In the following, differences from the first embodiment will be mainly described.

<2.1 Configuration of Unit Circuit>

Figure 10:
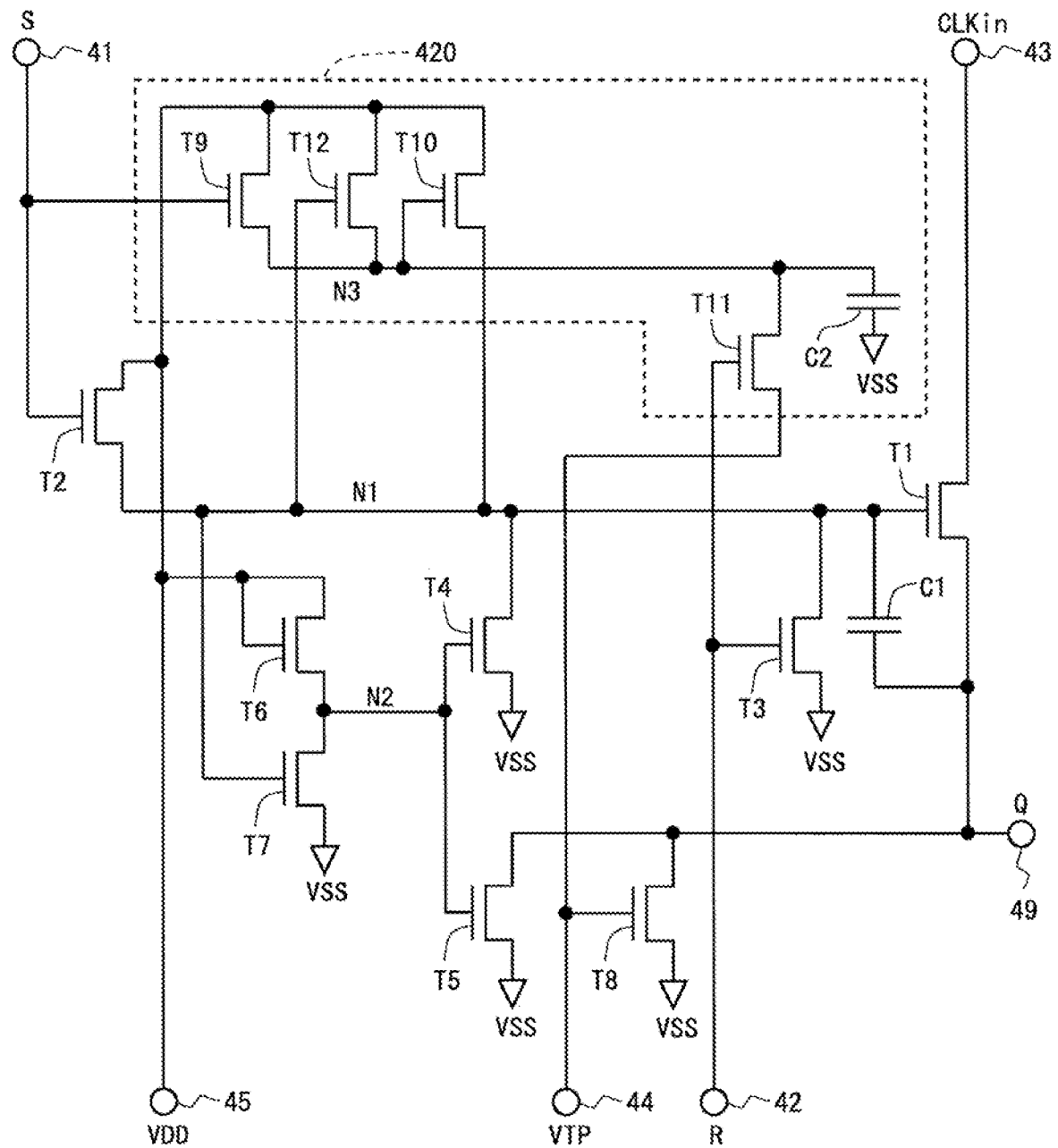
FIG. 10 is a circuit diagram illustrating a configuration of a unit circuit according to a second embodiment.

FIG. 10 is a circuit diagram illustrating a configuration of the unit circuit 4 according to this embodiment. As shown in FIG. 10, the unit circuit 4 according to this embodiment includes a thin film transistor T12, in addition to the components of the first embodiment (see FIG. 1). Regarding the thin film transistor T12, a gate terminal is connected to the first node N1, a drain terminal is connected to the input terminal 45, and a source terminal is connected to the third node N3. The thin film transistor T12 supplies an electric charge to the third node N3 as needed throughout a period in which the potential of the first node N1 is maintained at high level. It should be noted that the thin film transistor T12 realizes a second charge supply control transistor. In this embodiment, the thin film transistors T9 to T12 and the capacitor C2 constitute the charge supply unit 420 for supplying an electric charge to the first node N1. Further, while the gate terminal of the thin film transistor T11 is connected to the input terminal 43 in the first embodiment (see FIG. 1), the gate terminal of the thin film transistor T11 is connected to the input terminal 42 in this embodiment. Specifically, the thin film transistor T11 in this embodiment supplies the potential of the control signal VTP to the third node N3, when the reset signal R is at high level.

<2.2 Operation of Unit Circuit>

Next, an operation of the unit circuit 4 will be described. First, an operation when suspension of scanning is not performed is described, and then an operation when the suspension of scanning is performed is described.

<2.2.1 Operation when Suspension of Scanning is not Performed>

Figure 11:
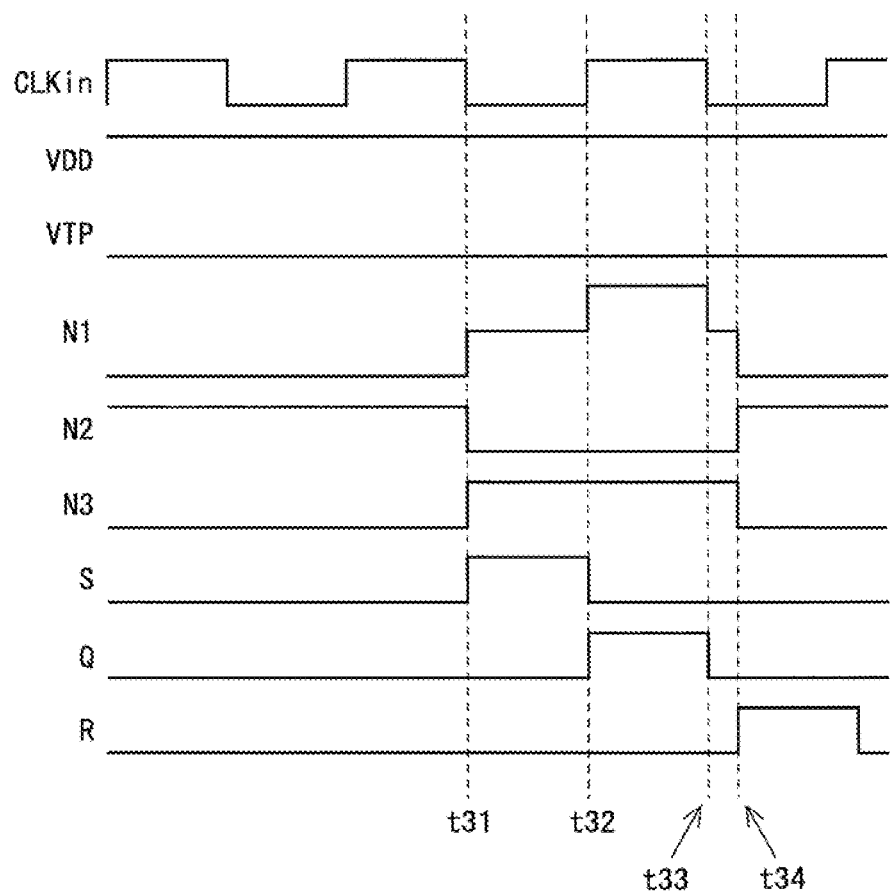
FIG. 11 is a signal waveform diagram for illustration of one example of an operation at the unit circuit when suspension of scanning is not performed according to the second embodiment.

FIG. 11 is a signal waveform diagram for illustration of one example of an operation at the unit circuit 4 when suspension of scanning is not performed. In a period before a time point t31, the control signal VTP is at low level, the potential of the first node N1 is at low level, the potential of the second node N2 is at high level, the potential of the third node N3 is at low level, the set signal S is at low level, the output signal Q is at low level, and the reset signal R is at low level. The input clock signal CLKin repeats high level and low level alternately. Since the potential of the second node N2 is at high level in the period before the time point t31 in this manner, similarly to the first embodiment, occurrence of an abnormal operation due to the clock operation of the input clock signal CLKin may be prevented.

At the time point t31, the set signal S changes from low level to high level, and an operation that is the same as the operation at the time point t11 (see FIG. 7) in the first embodiment is performed. Specifically, the potential of the first node N1 changes from low level to high level, the potential of the second node N2 changes from high level to low level, and the potential of the third node N3 changes from low level to high level. At this time, similarly to the first embodiment, normally, the thin film transistor T10 is maintained in the off state, and supply of an electric charge to the first node N1 is not performed. Further, as the gate-source voltage Vgs at the thin film transistor T12 becomes 0, the thin film transistor T12 is also maintained in the off state. Therefore, supply of an electric charge to the third node N3 via the thin film transistor T12 is not performed.

At a time point t32, the input clock signal CLKin changes from low level to high level. Then, similarly to the time point t12 (see FIG. 7) in the first embodiment, the potential of the first node N1 increases, and the potential of the output signal Q increases up to a level that is sufficient for the gate bus line GL connected to the output terminal 49 of this unit circuit 4 to be turned to the selected state. In the meantime, in this embodiment, unlike the first embodiment (see FIG. 1), the gate terminal of the thin film transistor T11 is connected to the input terminal 42 for receiving the reset signal R. As the reset signal R is maintained at low level at the time point t32, unlike the time point t12 in the first embodiment, the potential of the third node N3 is maintained at high level at the time point t32. At this time, as the first node N1 is in a bootstrapped state, the thin film transistor T10 is maintained in the off state even if the potential of the third node N3 is maintained at high level. Therefore, during a period from the time point t32 to a time point t33, supply of an electric charge to the first node N1 is not performed. In this regard, the period in which any first node N1 is bootstrapped is not assumed to be a long period like the suspension period, and therefore charge leakage at the thin film transistors T3 and T4 and the like may not cause any abnormal operation.

At the time point t33, the input clock signal CLKin changes from high level to low level. With this, similarly to the time point t13 (see FIG. 7) in the first embodiment, the potential of the output signal Q and the potential of the first node N1 decrease. The potential of the first node N1 decreases but not down to low level, and therefore the thin film transistor T10 is maintained in the off state similarly to the period from the time point t31 to the time point t32. It should be noted that, as the potential of the first node N1 is maintained at high level until a time point t34, the potential of the output terminal 49 becomes low level via the thin film transistor T1 in a period from the time point t33 to the time point t34 by the input clock signal CLKin changing from high level to low level.

At the time point t34, the reset signal R changes from low level to high level. With this, the thin film transistor T3 is turned to the on state. Then, by an operation that is the same as that at the time point t14 (see FIG. 7) in the first embodiment, the potential of the first node N1 decreases down to low level, and the potential of the second node N2 changes from low level to high level. Further, in this embodiment, the thin film transistor T11 is turned to the on state by the reset signal R changing from low level to high level. With this, the potential of the third node N3 becomes low level. At this time, the thin film transistor T10 is maintained in the off state. Moreover, as the potential of the first node N1 becomes low level, the thin film transistor T12 is also maintained in the off state. In a period after the time point t34, an operation that is the same as that in the period before the time point t31 is performed.

<2.2.2 Operation when Suspension of Scanning is Performed>

Figure 12:
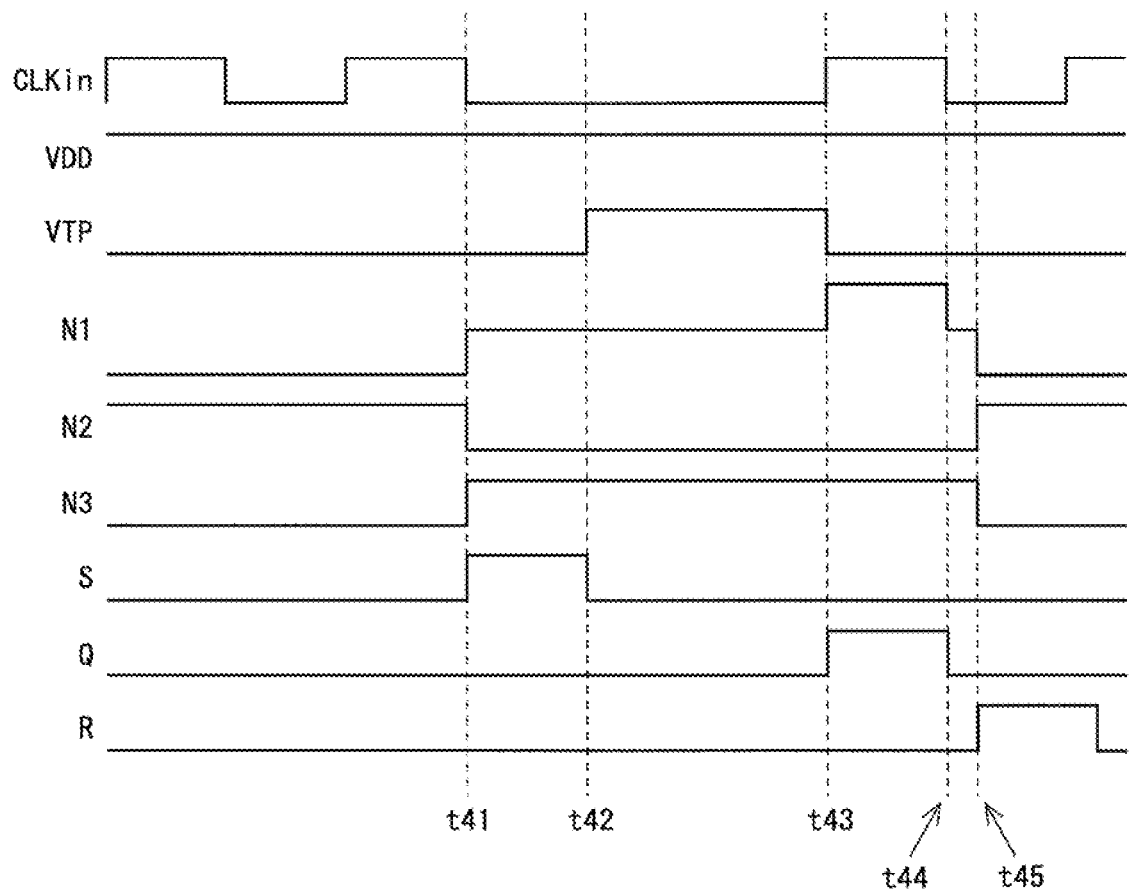
FIG. 12 is a signal waveform diagram for illustration of one example of an operation at the unit circuit (a unit circuit at a suspension stage) when suspension of scanning is performed according to the second embodiment.
Figure 13:
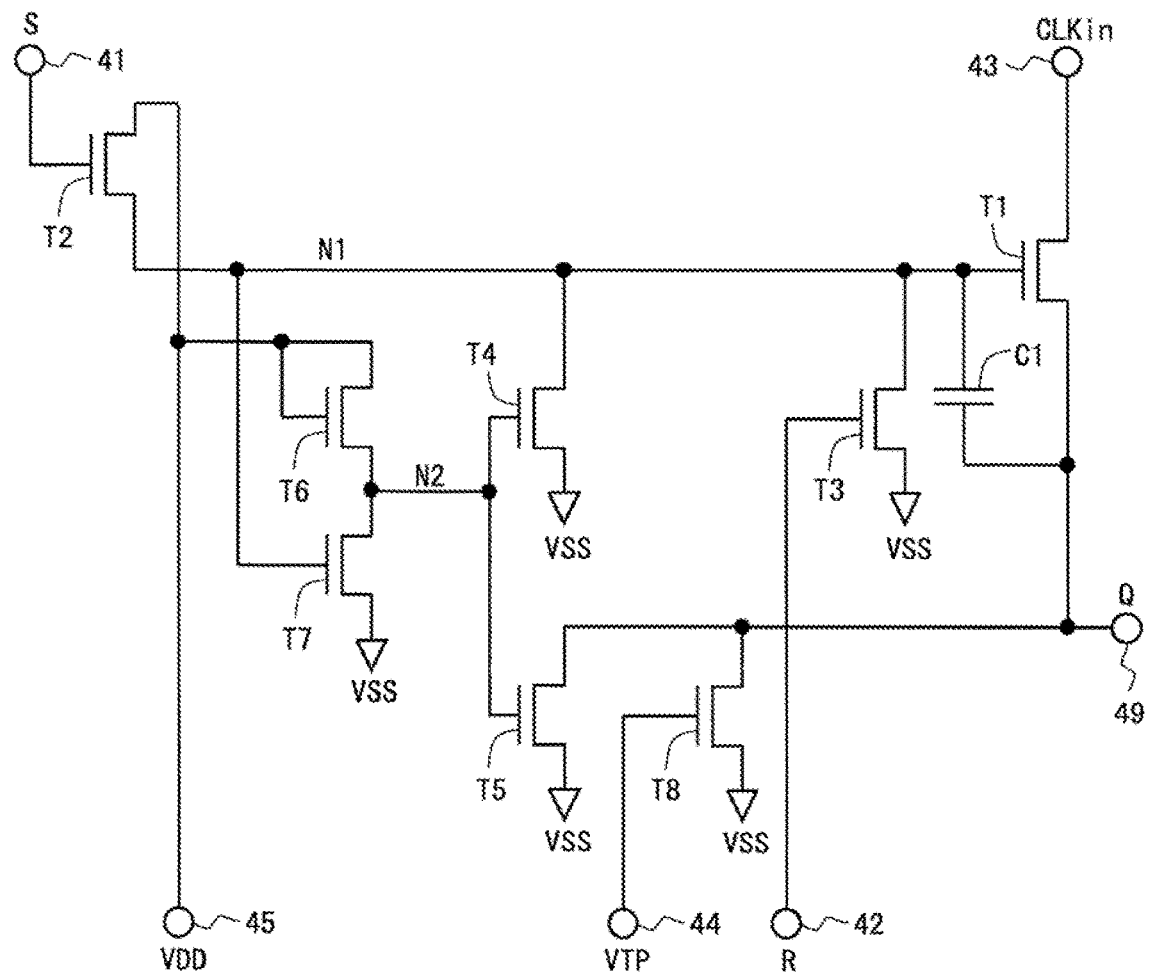
FIG. 13 is a circuit diagram illustrating an example of a configuration of a conventional unit circuit.
Figure 14:
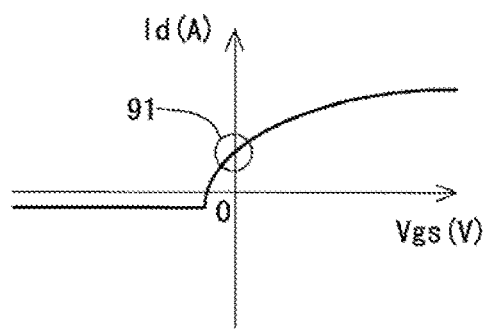
FIG. 14 is a diagram for illustration of off leakage.

FIG. 12 is a signal waveform diagram for illustration of one example of an operation at the unit circuit (a unit circuit at a suspension stage) 4 when suspension of scanning is performed. It should be noted that a period from a time point t42 to a time point t43 is assumed to be the suspension period. During a period before a time point t41, the same operation as in the period before the time point t31 (see FIG. 11) in which the suspension of scanning is not performed is performed. Also, during a period from the time point t41 to the time point t42, the same operation as in the period from the time point t31 to the time point t32 (see FIG. 11) in which the suspension of scanning is not performed is performed. Specifically, in the period from the time point t41 to the time point t42, the thin film transistor T10 and the thin film transistor T12 are maintained in the off state, and supply of an electric charge to the first node N1 and supply of an electric charge to the third node N3 are not performed.

At the time point t42, the set signal S changes from high level to low level, and the control signal VTP changes from low level to high level. By the control signal VTP changing to high level, similarly to the time point t22 (see FIG. 8) in the first embodiment, the thin film transistors T8 within all of the unit circuits 4 are turned to the on state, and the potentials of the output signals Q from all of the unit circuits 4 (that is, all of the potentials of the scanning signals G) are pulled to low level. As the reset signal R is maintained at low level, also after the time point t42, the thin film transistor T11 is maintained in the off state, and the potential of the third node N3 is maintained at high level. Here, if the gate-source voltage Vgs at the thin film transistor T10 becomes greater than a threshold voltage and a drain-source voltage Vds at the thin film transistor T10 becomes greater than 0 by the potential of the first node N1 decreasing, an electric charge is supplied to the first node N1 via the thin film transistor T10 by the thin film transistor T10 being turned to the on state. Further, the gate-source voltage Vgs if at the thin film transistor T12 becomes greater than a threshold voltage and a drain-source voltage Vds at the thin film transistor T12 becomes greater than 0 by the potential of the third node N3 decreasing, an electric charge is supplied to the third node N3 via the thin film transistor T12 by the thin film transistor T12 being turned to the on state. Therefore, the potential of the third node N3 is reliably maintained at high level throughout the suspension period. With this, a gate potential at the thin film transistor T10 is maintained at high level, and an electric charge is reliably supplied to the first node N1 when the potential of the first node N1 decreases. From the above, even if charge leakage occurs at the thin film transistors T3 and T4 in such a case as one in which duration of a suspension period is extended, a decrease of the potential of the first node N1 is reliably prevented, and the potential of the first node N1 may be maintained at a level that is sufficiently high.

At the time point t43, the suspension period ends, and the control signal VTP changes from high level to low level. With this, the thin film transistor T8 is turned to the off state. Further, at the time point t43, the input clock signal CLKin changes from low level to high level. At this time, the potential of the first node N1 is maintained at a level that is sufficiently high. From the above, an operation that is the same as the operation at the time point t32 (see FIG. 11) when the suspension of scanning is not performed is performed. With this, the potential of the output signal Q increases up to a level that is sufficient for the gate bus line GL connected to the output terminal 49 of this unit circuit 4 to be turned to the selected state. It should be noted that, similarly to the time point t32 (see FIG. 11) when the suspension of scanning is not performed, while the potential of the third node N3 is maintained at high level, supply of an electric charge to the first node N1 is not performed. Likewise, while the potential of the first node N1 is maintained at high level, supply of an electric charge to the third node N3 via the thin film transistor T12 is not performed.

At a time point t44, the input clock signal CLKin changes from high level to low level. With this, similarly to the time point t33 (see FIG. 11) when the suspension of scanning is not performed, the potential of the output signal Q and the potential of the first node N1 decrease. Further, similarly to the period from the time point t41 to the time point t42, supply of an electric charge to the first node N1 and supply of an electric charge to the third node N3 are not performed.

At a time point t45, the reset signal R changes from low level to high level. With this, an operation that is the same as that at the time point t34 (see FIG. 11) when the suspension of scanning is not performed is performed. Specifically, the potential of the first node N1 decreases down to low level, the potential of the second node N2 changes from low level to high level, and the potential of the third node N3 changes from high level to low level. The thin film transistor T10 and the thin film transistor T12 are maintained in the off state. In a period after the time point t45, an operation that is the same as that in the period before the time point t41 is performed.

<2.3 Effects>

According to this embodiment, similarly to the first embodiment, an electric charge is supplied to the first node N1 as needed throughout the suspension period. In this regard, the charge supply unit 420 according to this embodiment is provided with the thin film transistor T12 for supplying an electric charge to the third node N3 as needed throughout the period in which the potential of the first node N1 is maintained at high level. Accordingly, the potential of the third node N3 is reliably maintained at high level throughout the suspension period, and an electric charge is reliably supplied to the first node N1 throughout the suspension period. Therefore, even when the suspension period is set to be extended and even if charge leakage occurs at the thin film transistors T3 and T4, the potential of the first node N1 is reliably maintained at high level throughout the suspension period. As a result, it is ensured to restart the scanning normally from the suspension stage after the suspension period ends. Further, also in this embodiment, all of the unit circuits 4(1)-4(*i*) within the shift register 410 have the same configuration (the configuration shown in FIG. 10). From the above, according to this embodiment, it is possible to realize a shift register capable of performing suspension of scanning at any stage without complicating the pattern inspection in the manufacturing process.

3. Others

In the embodiments described above, the description is given taking the liquid crystal display device as an example. However, the present invention is not limited to such an example. The present invention may be applied to display devices of other types such as organic Electro Luminescence (EL).

Further, specific configurations of the unit circuits 4 that constitute the shift register 410 are not limited to the configurations (FIG. 1 and FIG. 10) described in the above embodiments. Moreover, although the example in which n-channel type thin film transistors are used as the thin film transistors within the unit circuit 4 is described in the above embodiments, the present invention may be applied to a case in which p-channel type thin film transistors are used.

Furthermore, the number of the phases and on duty (pulse width) of the gate clock signals are not limited to the examples described above. However, how the set signal S and the reset signal R are supplied from one unit circuit 4 to another unit circuit 4 should be determined appropriately based on the number of the phases and on duty of the gate clock signals.

Moreover, while the processing for the touch panel is performed during the suspension of the scanning in the above embodiments, the present invention is not limited to such an example. Processing other than the processing for the touch panel may be performed during the suspension of the scanning.

While the present invention has been described in detail in the above, the above description is only exemplary and illustrative, and not restrictive by any means. It is appreciated that a numerous number of variations and modifications may be conceivable without departing the scope of the present invention.

The present application claims priority to Japanese Patent Application No. 2017-219678 filed on Nov. 15, 2017, entitled "Shift Register and Display Device Provided with Same, which is herein incorporated by reference in its entirety.

What is claimed is:

1. A shift register configured to perform a shift operation based on a shift clock signal group including a plurality of clock signals, the shift register being configured by a plurality of stages having an identical configuration, wherein each of unit circuits that respectively constitute the stages includes:
a charge holding node configured to hold an electric charge in order to output an output signal at on level;
an output node configured to output the output signal;
an output control transistor having: a control terminal connected to the charge holding node; a first conducting terminal to which one of the plurality of clock signals included in the shift clock signal group is supplied; and a second conducting terminal connected to the output node; and
a charge supply unit including a charge supply control node that is turned to on level at identical timing with the charge holding node, the charge supply unit being configured to supply an electric charge to the charge holding node throughout a period after a potential of the charge supply control node becomes on level until the output signal at on level is outputted from the output node.

2. The shift register according to claim 1, wherein the charge supply unit includes:
a charge supply control node turn-on transistor having: a control terminal to which an output signal outputted from preceding one of the unit circuits is supplied; a first conducting terminal to which one of the outputted signal output from the preceding one of the unit circuits and a direct power-supply voltage at on level is supplied; and a second conducting terminal connected to the charge supply control node; and
a first charge supply control transistor having: a control terminal connected to the charge supply control node; a first conducting terminal to which the direct power-supply voltage at on level is supplied; and a second conducting terminal connected to the charge holding node.

3. The shift register according to claim 2, wherein the charge supply unit further includes a charge supply control node turn-off transistor having: a control terminal connected to the first conducting terminal of the output control transistor; a first conducting terminal connected to the charge supply control node; and a second conducting terminal to which an off-level voltage is supplied during a period excluding a suspension period in which a clock operation of the plurality of clock signals is suspended.

4. The shift register according to claim 2, wherein the charge supply unit further includes a second charge supply control transistor having: a control terminal connected to the charge holding node; a first conducting terminal to which the direct power-supply voltage at on level is supplied; and a second conducting terminal connected to the charge supply control node.

5. The shift register according to claim 4, wherein the charge supply unit further includes a charge supply control node turn-off transistor having: a control terminal to which an output signal outputted from succeeding one of the unit circuits is supplied; a first conducting terminal connected to the charge supply control node; and a second conducting terminal to which an off-level voltage is supplied during a period excluding a suspension period in which a clock operation of the plurality of clock signals is suspended.

6. The shift register according to claim 1, wherein each of the unit circuits further includes an output-node turn-off transistor having: an control terminal to which an on-level voltage is supplied during a suspension period in which a clock operation of the plurality of clock signals is suspended; a first conducting terminal connected to the output node; and a second conducting terminal to which a direct power-supply voltage at off level is supplied.

7. A display device, comprising:
a display unit having a plurality of scanning signal lines arranged thereon; and
a scanning signal line drive circuit configured to drive the plurality of scanning signal lines, wherein
the scanning signal line drive circuit includes the shift register according to claim 1 having the plurality of stages so as to respectively correspond to the plurality of scanning signal lines one by one.

* * * * *